United States Patent
Hansen

(10) Patent No.: US 6,839,125 B2
(45) Date of Patent: Jan. 4, 2005

(54) METHOD FOR OPTIMIZING AN ILLUMINATION SOURCE USING FULL RESIST SIMULATION AND PROCESS WINDOW RESPONSE METRIC

(75) Inventor: Steven George Hansen, Phoenix, AZ (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 10/361,831

(22) Filed: Feb. 11, 2003

(65) Prior Publication Data

US 2004/0156029 A1 Aug. 12, 2004

(51) Int. Cl.$^7$ .................. G03B 27/54; G03B 27/42; G03B 27/72; G03B 27/32; G06F 17/50
(52) U.S. Cl. ............... 355/67; 355/53; 355/71; 355/77; 703/13; 430/30
(58) Field of Search .............. 355/53, 67, 71, 355/77; 703/13, 22; 430/30

(56) References Cited

U.S. PATENT DOCUMENTS

| | | | |
|---|---|---|---|
| 5,305,054 A | | 4/1994 | Suzuki et al. |
| 5,523,193 A | * | 6/1996 | Nelson ................. 430/311 |
| 5,680,588 A | | 10/1997 | Gortych et al. |
| 6,049,660 A | | 4/2000 | Ahn et al. |
| 6,452,662 B2 | | 9/2002 | Mulkens et al. |
| 6,463,403 B1 | * | 10/2002 | Burdorf et al. ............. 703/22 |
| 6,466,304 B1 | * | 10/2002 | Smith .................... 355/71 |
| 2002/0035461 A1 | * | 3/2002 | Chang et al. .............. 703/13 |
| 2002/0045106 A1 | | 4/2002 | Baselmans et al. |
| 2002/0062206 A1 | | 5/2002 | Liebchen |
| 2002/0152452 A1 | | 10/2002 | Socha |
| 2002/0167653 A1 | * | 11/2002 | Mulkens et al. ............. 355/67 |
| 2003/0082463 A1 | | 5/2003 | Laidig et al. |
| 2003/0093251 A1 | * | 5/2003 | Chang .................... 703/13 |

OTHER PUBLICATIONS

Gau et al., "The Customized Illumination Aperture Filter for Low K1 Photolithography Process," SPIE 2000 vol. 4000 Optical Microlithography XIII, C. Progler (USA), pp. 271–282, (Mar. 2000).

Liu et al., "The Application of Alternating Phase–Shifting Masks to 140nm Gate Patterning: Line Width Control Improvements and Design Optimization," SPIE 98, vol. 3236, pp. 328–337, (1998).

Suzuki et al., "Multilevel Imaging System Realizing K1=0.3 Lithography," SPIE 1999 Optical Microlithography XII, vol. 3679, Luc Van Den Hove (USA), pp. 396–407, (1999).

Smith et al., "Illumination Pupil Filtering Using Modified Quadrupole Apertures," SPIE 1998 Optical Microlithography XI, vol. 3334, Luc Van Den Hove (USA), pp. 384–394, (1998).

Gau et al., "Strategy to Manipulate the Optical Proximity Effect by Post–Exposure Bake Processing," SPIE 1998 Optical Microlithography XI, vol. 3334, Luc Van Den Hove (USA), pp. 885–891, (1998).

(List continued on next page.)

Primary Examiner—Alan Mathews
(74) Attorney, Agent, or Firm—Pillsbury Winthrop LLP

(57) ABSTRACT

A method for optimizing the illumination conditions of a lithographic apparatus by computer simulation using full resist calculation, the lithographic apparatus comprising an illuminator, a projection system, and a mask having a pattern to be printed in a layer of photoresist material formed on a substrate. This method includes defining a lithographic 0problem, which may include a lithographic pattern to be printed on a wafer; choosing a resist model of a resist process to be used to print a pattern in the layer of photoresist material; selecting a grid of source points in a pupil plane of the illuminator; calculating separate responses for individual source points, each of the responses representing a result of a single or series of simulations using the resist model; and adjusting an illumination arrangement based on analysis of accumulated results of the separate calculations.

13 Claims, 14 Drawing Sheets

OTHER PUBLICATIONS

Hsia et al., "Customized Off–Axis Illumination Aperture Filtering for Sub–0.18um KrF Lithography," SPIE 1999 Optical Microlithography XII, vol. 3679, Luc Van Den Hove (USA), pp. 427–434, (1999).

Flagello et al., "Lithographic Lens Testing: Analysis of Measured Aerial Images, Interferometric Data And Photoresist Measurements," SPIE 1996 Microlithography Seminar 1996, (1996).

Flagello et al., "Towards a Comprehensive Control of Full–Field Image Quality In Optical Photolithography," SPIE Microlithography Seminar 1997, (Mar. 1997).

Burkhardt, "Illuminator Design for the Printing of Regular Contact Patterns," Microelectronics Engineering 41/42 1998, Elsevier (USA), (1998).

Wong et al., "Level–Specific Lithography Optimization for 1–GB DRAM," IEEE 2000 Transactions on Semiconductor Manufacturing, vol. 13, IEEE (USA), pp. 76–87, (2000).

Chen et al., "Practical Method for Full–Chip Optical Proximity Correction," SPIE 1997, Optical Microlithography X vol. 3051, Gene E. Fuller (USA), pp. 790–803.

Chen et al., "Optical Proximity Correction For Intermediate–Pitch Features Using Sub–Resolution Scattering Bars," J. Vac. Sci. Technol. B 15(6) 1997, The American Vacuum Society (USA), pp. 2426–2433.

* cited by examiner

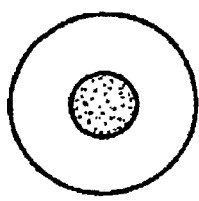
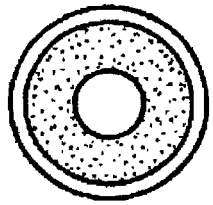
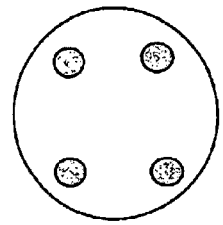
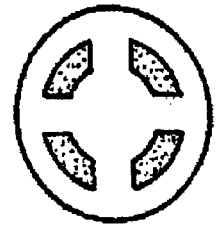
FIG. 2  FIG. 3  FIG. 4  FIG. 5
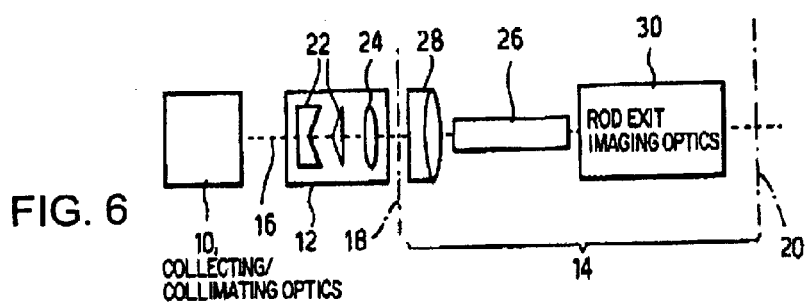
FIG. 6
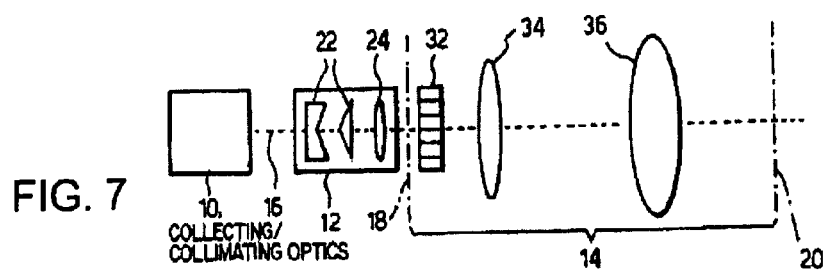
FIG. 7

- 0.15, 0.2, 0.3, 0.6σ conv

- 0.9/0.4 Q20

- 0.2, 0.3, 0.4σ + 0.9/0.4 Q20

- 0.3σ + 0.9/0.4 Q15

DOF@8%EL predicted

| trial illuminator | prediction based on weighted and interpolated source measurements | Prolith simulation with this illuminator |
|---|---|---|
| 0.85_0.55Q30 | 0.293u | 0.23u |
| 0.75_0.55Q20 | 0.416 | 0.41 |
| 0.80_0.60Q20 | 0.383 | 0.355 |
| 0.80_0.60annular | 0.110 | 0.10 |
| 0.75_0.55annular | 0.118 | 0.105 |

FIG. 19

METHOD FOR OPTIMIZING AN ILLUMINATION SOURCE USING FULL RESIST SIMULATION AND PROCESS WINDOW RESPONSE METRIC

BACKGROUND OF THE INVENTION

1. Field of the Invention

The present invention relates to a method for optimizing an illumination source of a lithographic apparatus using full resist simulation.

2. Description of the Related Art

The term "patterning device" as here employed should be broadly interpreted as referring to a device that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device. An example of such a patterning device is a mask. The concept of a mask is well known in lithography, and it includes mask types such as binary, alternating phase shift, and attenuated phase shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

Another example of a patterning device is a programmable mirror array. One example of such an array is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix addressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described hereabove, the patterning device can comprise one or more programmable mirror arrays. More information on mirror arrays as here referred to can be seen, for example, from U.S. Pat. Nos. 5,296,891 and 5,523,193, and PCT publications WO 98/38597 and WO 98/33096. In the case of a programmable mirror array, the support structure may be embodied as a frame or table, for example, which may be fixed or movable as required.

Another example of a patterning device is a programmable LCD array. An example of such a construction is given in U.S. Pat. No. 5,229,872. As above, the support structure in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies on a substrate (silicon wafer) that has been coated with a layer of radiation sensitive material (resist). In general, a single wafer will contain a whole network of adjacent target portions that are successively irradiated via the projection system, one at a time. In current apparatuses, employing patterning by a mask on a mask table, a distinction can be made between two different types of machines. In one type of lithographic projection apparatus, each target portion is irradiated by exposing the entire mask pattern onto the target portion at once. Such an apparatus is commonly referred to as a wafer stepper. In an alternative apparatus, commonly referred to as a step and scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally<1), the speed V at which the substrate table is scanned will be a factor M times that at which the mask table is scanned. More information with regard to lithographic devices as here described can be seen, for example, from U.S. Pat. No. 6,046,792.

In a known manufacturing process using a lithographic projection apparatus, a pattern (e.g. in a mask) is imaged onto a substrate that is at least partially covered by a layer of radiation sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement and/or inspection of the imaged features. This array of procedures is used as a basis to pattern an individual layer of a device, e.g. an IC. Such a patterned layer may then undergo various processes such as etching, ion-implantation (doping), metallization, oxidation, chemical, mechanical polishing, etc., all intended to finish off an individual layer. If several layers are required, then the whole procedure, or a variant thereof, will have to be repeated for each new layer. It is important to ensure that the overlay (juxtaposition) of the various stacked layers is as accurate as possible. For this purpose, a small reference mark is provided at one or more positions on the wafer, thus defining the origin of a coordinate system on the wafer. Using optical and electronic devices in combination with the substrate holder positioning device (referred to hereinafter as "alignment system"), this mark can then be relocated each time a new layer has to be juxtaposed on an existing layer, and can be used as an alignment reference. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection system may hereinafter be referred to as the "lens." However, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens." Further, the lithographic apparatus may be of a type having two or more substrate tables (and/or two or more mask tables). In such "multiple stage" devices the additional tables may be used in parallel or preparatory steps may be carried out on one or more tables while one or more other tables are being used for exposures. Dual stage lithographic apparatuses are described, for example, in U.S. Pat. No. 5,969,441 and WO 98/40791.

In order to keep pace with Moore's law and develop features having sub-wavelength resolution, it has become necessary to use a variety of resolution enhancement techniques (RET). Historically, the Rayleigh criteria for resolution (R) and depth of focus (DOF) have been utilized to evaluate the performance of a given technology:

$$R = k_1 \lambda / NA$$

$$DOF = +/- k_2 \lambda / NA^2$$

where $k_1$ and $k_2$ are process dependent factors, $\lambda$ is wavelength, and NA is numerical aperture. Depth of focus is one of the factors determining the resolution of the lithographic apparatus and is defined as the distance along the optical axis over which the image of the pattern is adequately sharp.

The resolution limit of currently available lithographic techniques is being reached due to a decrease in the depth of focus, difficulty in the design of lenses and complexities in the lens fabrication technology. A lower limit on the value of the constant $k_1$ is approximately 0.25.

The control of the relative size of the illumination system numerical aperture (NA) has historically been used to optimize the resolution of a lithographic projection tool. Control of this NA with respect to the projection systems objective lens NA allows for modification of spatial coherence at the mask plane, commonly referred to as partial coherence σ. This is accomplished through specification of the condenser lens pupil in a Köhler illumination system. Essentially, this allows for manipulation of the optical processing of diffraction information. Optimization of the partial coherence of a projection imaging system is conventionally accomplished using full circular illuminator apertures. By controlling the distribution of diffraction information in the objective lens with the illuminator pupil size, maximum image modulation can be obtained. Illurnination systems can be further refined by considering variations to full circular illumination apertures. A system where illumination is obliquely incident on the mask at an angle so that the zero-th and first diffraction orders are distributed on alternative sides of the optical axis may allow for improvements. Such an approach is generally referred to as off-axis illumination. Off-axis illumination improves resolution by illuminating the mask with radiation that is at an angle to the optical axis of the lens. The incidence of the radiation on the mask, which acts as a diffraction grating, improves the contrast of the image by transmitting more of the diffracted orders through the lens. Off-axis illumination techniques used with conventional masks produce resolution enhancement effects similar to resolution enhancement effects obtained with phase shifting masks. Besides off-axis illumination, other currently available RET include optical proximity correction (OPC) of optical proximity errors (OPE), phase shifting masks (PSM), and sub-resolution assist features (SRAF). Each technique may be used alone, or in combination with other techniques to enhance the resolution of the lithographic projection tool.

One approach to generate off-axis illumination is to incorporate a metal aperture plate filter into the fly eye lens assembly of the projection system illuminator providing oblique illumination. A pattern on such a metal plate would have four symmetrically arranged openings (zones) with sizing and spacing set to allow diffraction order overlap for specific geometry sizing and duty ratio on the photomask. Such an approach results in a significant loss in intensity available to the mask, lowering throughput and making the approach less than desirable. Additionally, the four circular openings need to be designed specifically for certain mask geometry and pitch and do not improve the performance of other geometry sizes and spacings. The previous work in this area describes such a method using either two or four openings in the aperture plate. See, for example, EP 0 500 393, U.S. Pat. Nos. 5,305,054, 5,673,103, 5,638,211, EP 0 496 891 and EP 0 486 316.

Another approach to off-axis illumination using the four-zone configuration, which is disclosed in U.S. Pat. No. 6,452,662 incorporated herein by reference in its entirety, is to divide the illumination field of the projection system into beams that can be shaped to distribute off-axis illumination to the photomask. By incorporating the ability to shape off-axis illumination, throughput and flexibility of the exposure source is maintained. Additionally, this approach allows for illumination that combines off-axis and on-axis (conventional) characteristics. By doing so, the improvement to dense features that are targeted with off-axis illumination is less significant than straight off-axis illumination. The performance of less dense features, however, is more optimal because of the more preferred on-axis illumination for these features. The result is a reduction in the optical proximity effect between dense and isolated features. Optimization is less dependent on feature geometry and more universal illumination conditions can be selected.

Referring to FIGS. 2–5, currently available illumination intensity distributions or arrangements include small, or low, sigma (FIG. 2), annular (FIG. 3), quadrupole (FIG. 4), and quasar (FIG. 5), with the illuminated areas (hereinafter referred to as the aperture(s)) shown in cross section. The annular, quadrupole and-quasar illumination techniques of FIGS. 3–5 are examples of off-axis illumination schemes.

Small sigma illumination is incident on the mask with approximately zero illumination angle. (i.e. almost perpendicular to the mask) and produces good results with phase shifting masks to improve resolution and increase the depth of focus. Annular illumination is incident on the mask at angles that are circularly symmetrical and improves resolution and increases depth of focus while being less pattern dependent than other illumination schemes. Quadrupole and quasar illumination are incident on the mask with four main angles and provide improved resolution and increased depth of focus while being strongly pattern dependent.

Referring to FIGS. 6 and 7, two conventional illumination systems IL are schematically illustrated. The systems illustrated in FIGS. 6 and 7 include light collecting/collimating optics 10; an axicon/zoom module 12; and light integrating and projecting optics 14. The illumination systems IL define an optical axis 16, a pupil plane 18, and a mask plane 20. The axicon/zoom module 12 comprises a pair of axicons 22, one concave and one convex, whose separation can be varied. The module 12 also comprises a zoom lens 24.

For the case of conical axicons, some examples of the illumination intensity distributions achievable at the pupil plane 18 are shown in FIG. 8. The spot size can be varied between states A and B by changing the zoom lens position. Similarly, the annularity can be changed between states A and C by varying the axicon opening (separation between the axicons).

To improve the illumination homogeneity, an optical integrator 26 is used. In FIG. 6 the optical integrator takes the form of a light pipe 26, such as a glass, calcium fluoride or quartz rod. A coupler 28 couples the illumination at the pupil plane 18 into the rod 26, and rod exit imaging optics 30 are also provided. In FIG. 7 a fly's eye element 32 acts as the integrator. The fly's eye element 32 is a composite lens comprising an array or honeycomb of small lenses. Further, objective lenses 34 and 36 complete the projection optics.

Photolithographic simulations may be used to aid in the development, optimization and use of lithographic apparatuses. They can be extremely helpful as a development tool, by quickly evaluating options, optimizing processes, and saving time and money by reducing the number of required experiments. Simulations can also be helpful in the research context for understanding many physical phenomena that occur when pushing the limits of resolution to achieve feature size in the order of or below the wavelength of the lithographic apparatus.

Traditionally, simulations have been used exhaustively in the context of process development by defining the best illumination conditions in terms of depth of focus, exposure latitude or dose-to-size for printing a pattern onto a substrate. Exposure latitude is defined as the percentage dose range where the printed pattern's critical dimension (CD) is acceptable, typically ±10%. It is a fundamental quantity depending on the quality of the projected image and the contrast of the resist process. Dose-to-size, also denoted as $E_{1:1}$, refers to the dose that is necessary to print the pattern to the desired size. The depth of focus and the exposure latitude are used to determine the process window, which describes the regions of focus and exposure that keeps the final resist profile within prescribed specifications.

Generally, in order to define the best illumination conditions of the illuminator and to select an appropriate design of aperture, a standard approach consists of simulating the incident light energy distribution onto the photoresist surface. This quantity is defined as aerial image, in reference to the fact that the intensity of the light is in a plane at the top of the photoresist, prior to entering into the resist. The calculated image can be evaluated versus some predetermined criteria to judge whether the image has enough contrast to successfully print the desired feature in photoresist on the wafer. The aerial image can be analyzed to provide estimates of the exposure latitude and depth of focus and the procedure can be performed iteratively to arrive at the best optical conditions.

Practically, the quality of the aerial image is determined by using a normalized aerial image log-slope (NILS) metrics (normalized to the feature size). This value corresponds to the log of the slope of the intensity image (or aerial image). Traditionally, the standard approach of determining the best illumination setting or shape uses an analysis of aerial image metrics (e.g. NILS or contrast) at some fixed defocus value. The best lithographic process latitude is usually found when the aerial image quality is high.

In order to simulate the aerial image of the mask pattern, the parameters of the different elements of the photolithographic apparatus are required as input parameters in the simulation programs. These parameters typically comprise geometric parameters of the projection system and the illuminator, and optical parameters such as the numerical aperture NA of the projection system and the partial coherence factor σ of the photolithographic apparatus. Although many parameters may be required to adequately determine the profile of the aerial image at the top of the photorcsist, the theory used to calculate the image is well developed and is based on the Fourier optics either in its scalar or vector form. As a result, aerial images obtained with complicated optical arrangements can be calculated relatively easily and quickly with this method, making simulations based on a "pure aerial image" attractive for process development engineers.

Yet, even though this "pure aerial image" approach is commonly used today to optimize the illumination conditions, it does not accurately predict the final image printed onto the substrate. This is due to the fact that this approach disregards the effects of the image receiver, i.e., the photoresist. For instance, the interaction of the electromagnetic field with the photoresist, also referred to as the vector effects, and the physical and chemical characteristics of the resist are not accounted for in the calculation. Basically, in order to match the predictions of the aerial image calculations that use a fixed intensity threshold to determine the printed CD, the photoresist would have to exhibit inifinite dissolution contrast with zero diffusion of the photo-generated species. Unfortunately, such photoresist processes do not exist. An accurate photoresist simulation model includes the effects associated with diffusion of the active species (which "smear" the projected optical image) and the finite dissolution contrast of the real photoresist, and gives predictions which match experiment. The reasons for differences between aerial image predictions and real resist processes, and some of their characteristics, is discussed in "The Resist Vector: Connecting the Aerial Image to Reality," Proc. SPIE, Vol. 4690, p. 366 (2002), the entire contents of which are incorporated herein by reference.

Therefore, in order to accurately predict the process window, a full resist calculation is necessary. Ideally, this calculation should take into account the steps of photoresist exposure, photoresist baking (PEB) and photoresist developing. Photoresist exposure occurs when the projection beam changes the chemical nature of the resist by activating the molecules of the resist material. Depending on the nature of the resist, i.e. conventional i-line resist or chemically amplified resist, different models can be used to simulate the interaction between the projection beam and the resist material and to calculate the change of the absorption coefficient of the resist material.

As of today, models have been developed to simulate these different steps and can be implemented in simulation software, such as Prolith™ or Solid-C™. However, due to the multitude of parameters, a full resist calculation remains complicated, time-consuming and expensive, even with simplified models. As a result, optimization of the illumination conditions with the aid of simulations does not currently use a full resist calculation.

SUMMARY OF THE INVENTION

It is an aspect of the present invention to provide a method for optimizing the illumination conditions by computer simulation using full resist calculation. The present invention provides optimization of illumination conditions of various responses of a lithographic projection apparatus, including, for example, the process window (exposure/dose latitude versus depth of focus), side lobe printing and mask error enhancement factor.

This and other aspects are achieved according to the invention by a method for optimizing the illumination conditions of a lithographic apparatus by computer simulation using full resist calculation, wherein the lithographic apparatus comprises an illuminator, a projection system and a mask having a pattern to be printed in a layer of photoresist material formed on a substrate; the method including defining a lithographic pattern to be printed on a wafer; choosing a resist model of a resist process to be used to print a pattern in the layer of photoresist material; selecting a grid of source points in a pupil plane of the illuminator; calculating separate responses for individual source points, each of the responses representing a result of a single or series of simulations using the resist model; and adjusting an illumination arrangement based on analysis of accumulated results of the separate calculations.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid crystal display panels, thin film magnetic heads, etc. It should be appreciated that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as particle beams, such as ion beams or electron beams.

BRIEF DESCRIPTION OF THE DRAWINGS

Embodiments of the invention will now be described, by way of example only, with reference to the accompanying schematic drawings in which:

FIG. 2 is a schematic illustration of a small, or low, sigma illumination arrangement;

FIG. 3 is a schematic illustration of an annular off-axis illumination arrangement;

FIG. 4 is a schematic illustration of an off-axis quadrupole illumination arrangement;

FIG. 5 is a schematic illustration if an off-axis quasar illumination arrangement;

FIG. 6 is a schematic illustration of a known illumination system;

FIG. 7 is a schematic illustration of another known illumination system;

FIG. 19 is a table showing the DOF values for several illumination arrangements obtained with a commercial simulation software (Prolith™) and with the method of the present invention according to one embodiment that uses weighted dose and interpolated source measurements;

DETAILED DESCRIPTION

Figure 1:
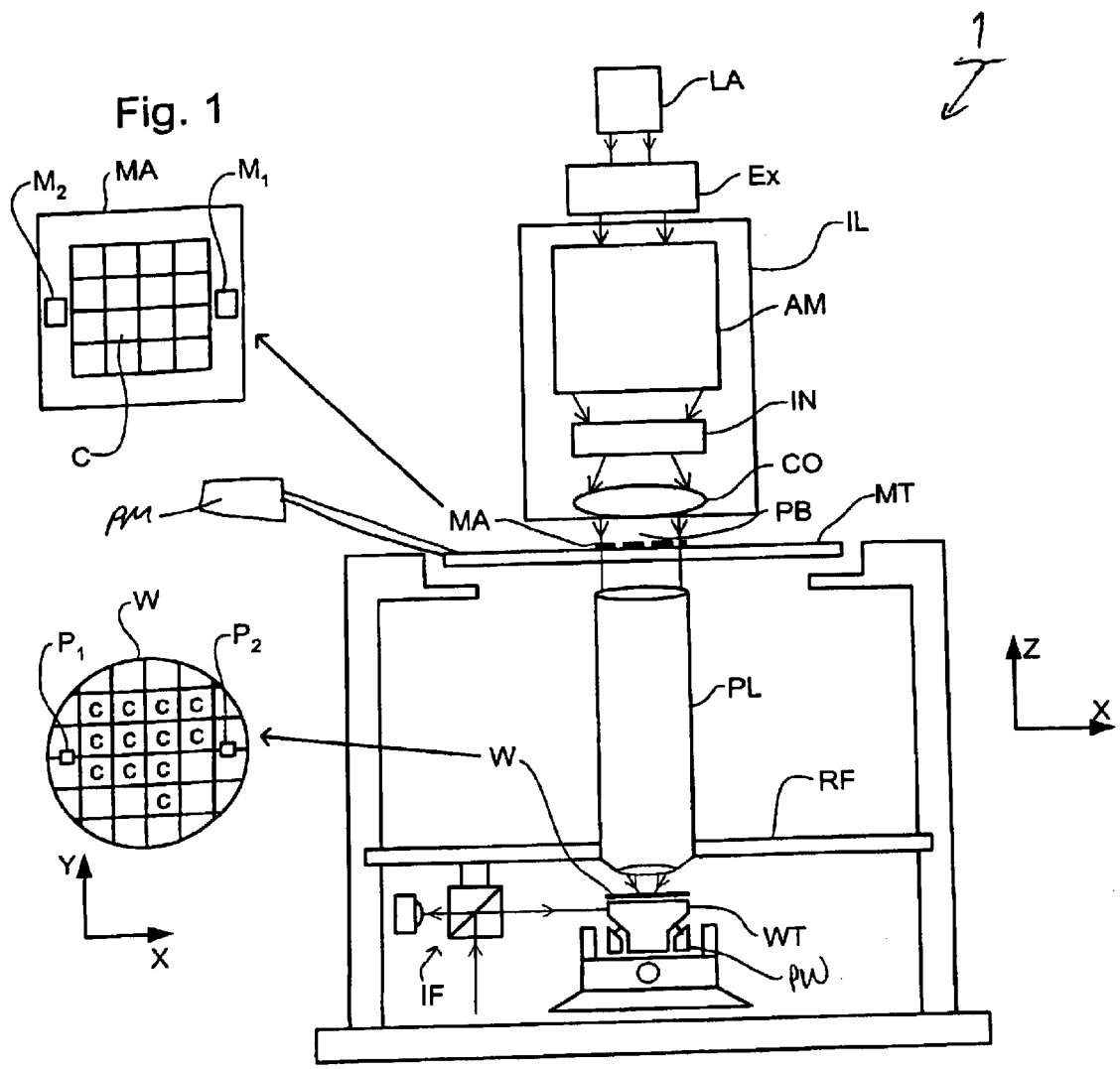
FIG. 1 is a schematic illustration of a photolithographic projection apparatus.

FIG. 1 schematically depicts a lithographic projection apparatus 1 according to an embodiment of the invention. The apparatus includes a radiation system Ex, IL constructed and arranged to supply a projection beam PB of radiation (e.g. UV or EUV radiation, such as, for example, generated by an excimer laser operating at a wavelength of 248 nm, 193 nm or 157 nm, or by a laser-fired plasma source operating at 13.6 nm). In this embodiment, the radiation system also comprises a radiation source LA. The apparatus also includes a first object (mask) table MT provided with a mask holder constructed and arranged to hold a mask MA (e.g. a reticle), and connected to a first positioning device PM to accurately position the mask with respect to a projection system or lens PL; a second object (substrate) table WT provided with a substrate holder constructed and arranged to hold a substrate W (e.g. a resist-coated silicon wafer), and connected to a second positioning device PW to accurately position the substrate with respect to the projection system or lens PL. The projection system or lens PL (e.g. a quartz and/or $CaF_2$ lens system or a refractive or catadioptric system, a mirror group or an array of field deflectors) is constructed and arranged to image an irradiated portion of the mask MA onto a target portion C (e.g. comprising one or more dies) of the substrate W. The projection system PL is supported on a reference frame RF.

As here depicted, the apparatus is of a transmissive type (i.e. has a transmissive mask). However, in general, it may also be of a reflective type, (e.g. with a reflective mask). Alternatively, the apparatus may employ another kind of patterning device, such as a programmable mirror array of a type as referred to above.

The source LA (e.g. a UV excimer laser, an undulator or wiggler provided around the path of an electron beam in a storage ring or synchrotron, a laser-produced plasma source, a discharge source or an electron or ion beam source) produces a beam PB of radiation. The beam PB is fed into an illumination system (illuminator) IL, either directly or after having traversed a conditioner, such as a beam expander Ex, for example. The illuminator IL may comprise an adjusting device AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors). The latter scenario is often the case when the source LA is an excimer laser. The present invention encompasses both of these scenarios. In particular, the present invention encompasses embodiments wherein the radiation system Ex, IL is adapted to supply a projection beam of radiation having a wavelength of less than about 250 nm, such as with wavelengths of 248 nm, 193 nm, 157 nm, 126 nm and 13.6 nm, for example.

The beam PB subsequently intercepts the mask MA, which is held on the mask table MT. Having traversed the mask MA, the beam PB passes through the lens PL, which focuses the beam PB onto a target portion C of the substrate W. With the aid of the second positioning device PW and interferometer IF, the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning). However, in the case of a wafer stepper (as opposed to a step and scan apparatus) the mask table MT may just be connected to a short stroke actuator, or may be fixed. The mask MA and the substrate W may be aligned using mask alignment marks $M_1$, $M_2$ and substrate alignment marks $P_1$, $P_2$.

The depicted apparatus can be used in two different modes:

1. In step mode, the mask table MT is kept essentially stationary, and an entire mask image is projected at once, i.e. a single "flash," onto a target portion C. The substrate table WT is then shifted in the X and/or Y directions so that a different target portion C can be irradiated by the beam PB;
2. In scan mode, essentially the same scenario applies, except that a given target portion C is not exposed in a single "flash." Instead, the mask table MT is movable in a given direction (the so-called "scan direction", e.g. the Y direction) with a speed v, so that the projection beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 9:
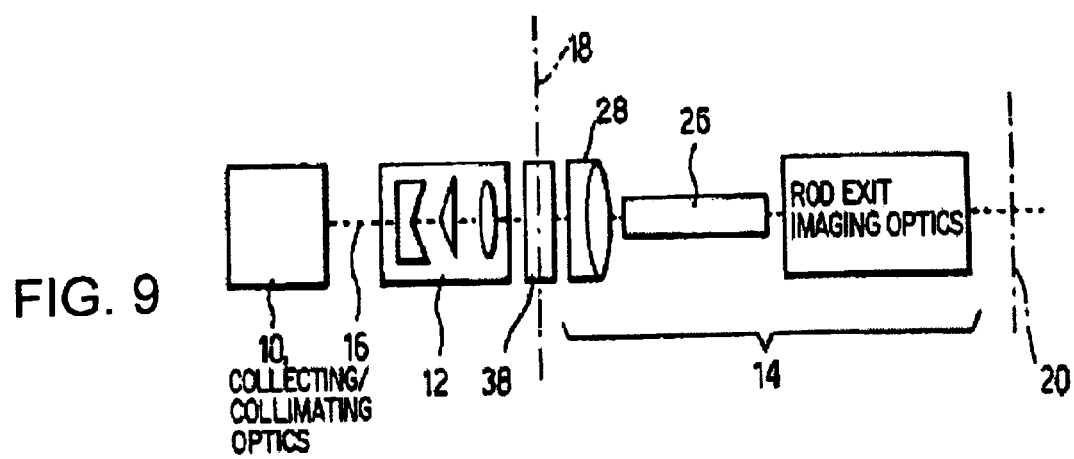
FIG. 9 is a schematic illustration of an illumination system for use in the invention.

Referring to FIG. 9, the illumination system IL includes light collecting/collimating optics 10; an axicon/zoom module 12; a multipole mode generating element 38; and light integrating and projecting optics 14. The components lie along optical axis 16 and are used to illuminate the mask MA located at a mask plane 20 which then produces an exposure pattern in resist on the wafer W via the projection system or lens PL. The illumination system IL illustrated in FIG. 9 includes a quartz rod light integrator 26. The optical axis 16 shown in FIG. 9 can of course be folded to produce a more compact illumination system.

Figure 10A:
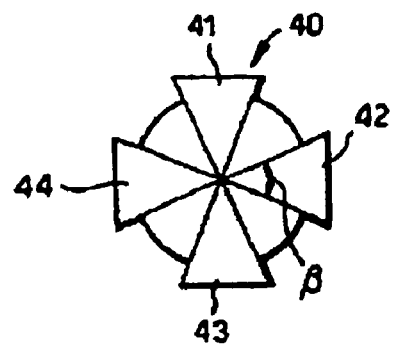
FIG. 10a is a schematic illustration of a multipole mode generating element of the illumination system of FIG. 9.
Figure 10B:
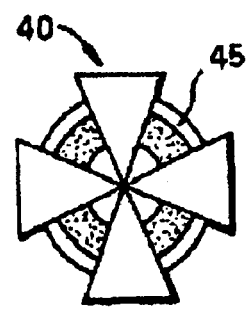
FIG. 10b is a schematic illustration of a multipole mode generating element according to an another exemplary embodiment of the invention.
Figure 11:
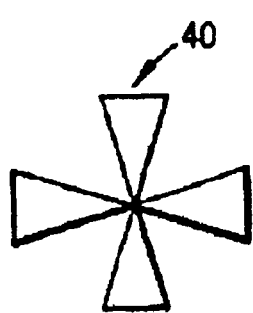
FIG. 11 is a schematic illustration of a multipole mode generating element according to another exemplary embodiment of the invention.

An exemplary embodiment of the multipole mode generating element 38 is shown in FIG. 10a. The element 38 has four triangular blades 41, 42, 43, 44 insertable into the beam path at the pupil plane 18 and which form a Maltese cross 40, which is also referred to herein as a Maltese aperture blade (MAB). Each blade has an apex angle β. FIG. 10b shows the illumination intensity distribution resulting from the combination of an annular illumination mode produced by the axicon/zoom module 12 and the MAB 40. The distribution has four light beams or poles 45. This embodiment enables continuously variable quadrupole illumination modes to be produced. The radial position of each pole 45 can be varied by adjusting the axicon optics 22, the radial width of each pole can be varied by adjusting the zoom lens 24, and the tangential pole width can be changed by inserting another set of blades having a different apex angle β1, such as Maltese cross 40 shown in FIG. 11. By removing the blades altogether, the illumination system can be used for conventional and/or annular modes, again with continuous variation.

Interposing blades of a different apex angle permits the tangential pole width to be changed in discrete steps. According to another embodiment of the invention, the tangential pole width can be continuously varied by each arm of the Maltese cross comprising a stack of n blades, rotatable with respect to each other about the optical axis of the system where their vertices lie.

According to a further embodiment, just two blades are used as the multipole mode generating element 38 in an optical system which includes a light pipe, such as a rectangular quartz rod 26, as shown in the illumination system of FIG. 9. One of the blades is oriented parallel to the short side of the rectangular cross-section of the light pipe 26 and the other blade parallel to the long side. Due to the multiple reflections in the pipe 26, the resulting illumination mode is a mixture of annular and quadrupole. The two-blade system can produce an illumination mode including a quadruple component with lower energy-loss than the Maltese cross arrangement, as there are fewer blades obstructing the light beam. In one example the blades are triangular and are like two perpendicular arms of a Maltese cross, e.g. blades 41 and 42 shown in FIG. 10a. One or both of the blades in this embodiment can be a composite blade comprising a stack of smaller rotatable blades as described above.

Typically the blades are positioned along directions corresponding to orthogonal lines on the mask MA, so that the light poles 45 are located in each quadrant with centers 45° from the orthogonal lines. This orientation can produce optimal projection of the lines, particularly for dense structures, such as for DRAM-like structures. The orthogonal lines are generally referred to as horizontal and vertical. As pattern features decrease in size, light poles located in each quadrant with centers 90° from the orthogonal lines become more preferred. The optimal sigma for quadrupole illumination can be estimated from the formula: $\sigma=\lambda/(\sqrt{2} \text{ NA·pitch})$, and for dipole and 45° rotated quadrupole from: $\sigma=\lambda/(2 \text{ NA·pitch})$ A further variation on the above embodiments using blades is to make all the blades rotatable about the optical axis 16 of the illumination system so that the position of the poles can be rotated.

Figure 12:
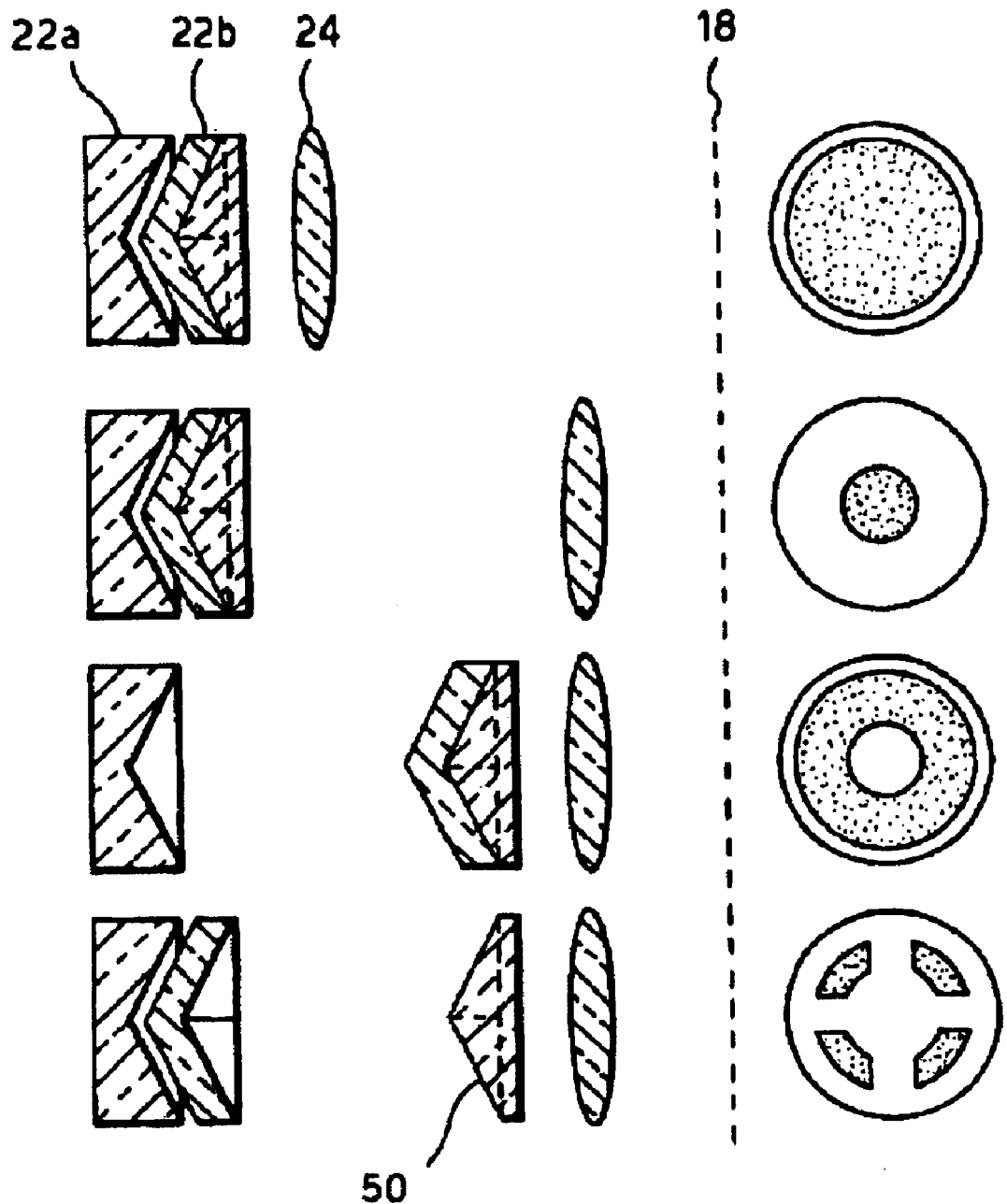
FIG. 12 is a schematic cross section illustration of an illumination system for use in the invention and the resulting illumination arrangements obtainable therewith.

Referring to FIG. 12, another exemplary embodiment of the present invention includes the axicon/zoom module with a pyramidal prism 50 as the multipole mode generating element. This also enables conventional, annular and quadrupole illumination to be produced with continuous variations of the modes. FIG. 12 shows the optical components of an axicon/zoom module. The right hand column in FIG. 12 shows the illumination intensity distributions at the pupil plane 18 for various positions of the axicon pair 22a, 22b and zoom lens 24. The axicon pair 22 comprises a pair of elements having conical surfaces, one concave 22a, one convex 22b, to produce circular and annular illumination patterns. The fourth row shows the effect of separating the pyramid-shaped prism 50 from convex element 22b. The side of the convex element 22b facing the pyramid 50 is concave pyramidal for receiving the pyramid 50. The convex element 22b and pyramid 50 comprise a second axicon also known as a pyramidal axicon or pyramidon. The pyramid-shaped prism 50 has a four-sided base, which consequently produces quadrupole mode illumination patterns, such as the four spots illustrated at the bottom in the right hand column in FIG. 12.

The axicon/zoom module of FIG. 12 allows the illumination mode to be varied continuously from conventional to annular or quadrupole. The zoom lens 24 sets the spot size or partial coherence factor, the axicon pair 22 determines the annularity, and the pyramid 50 determines the quadrupolarity. In addition, since light flux is redistributed rather than blocked, there is virtually no light loss, so that a high throughput can be maintained.

Figure 13:
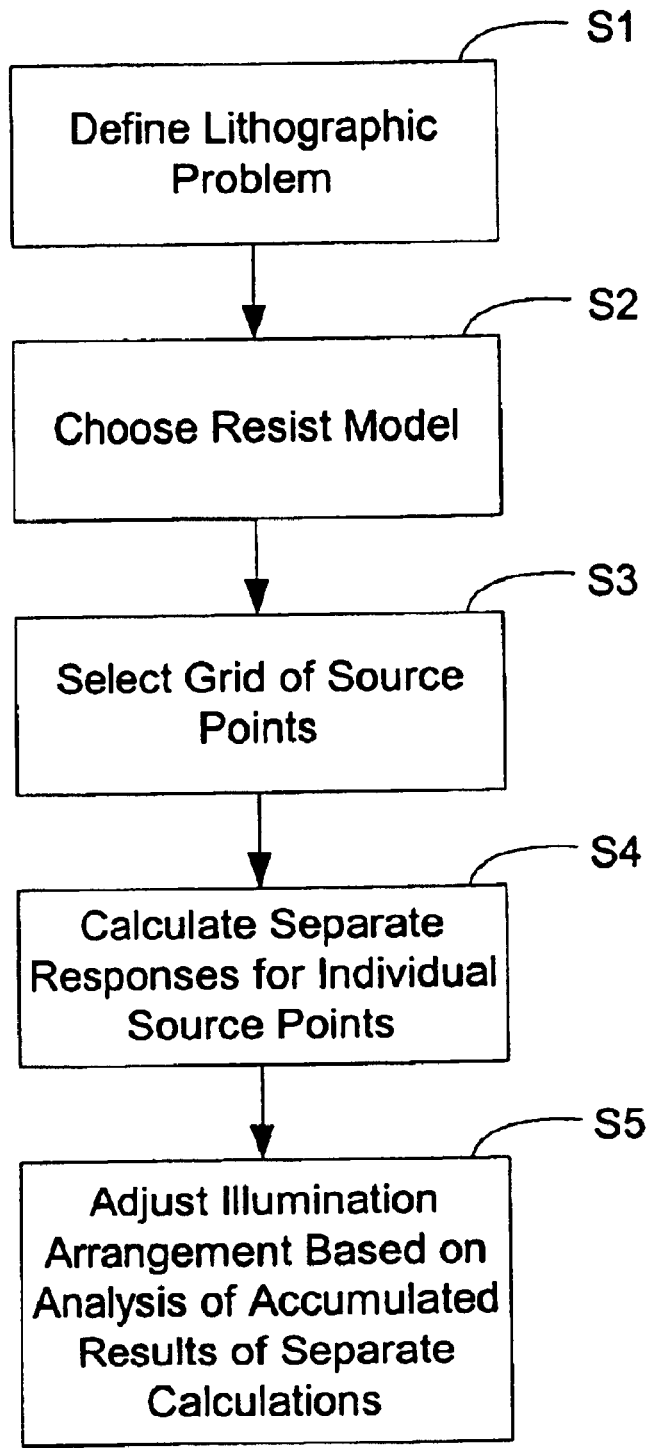
FIG. 13 is a flowchart illustrating a method for optimizing the illumination.

Referring to FIG. 13, an exemplary embodiment of a method for obtaining the process window of a lithographic problem will now be explained.

The method begins in SI where a lithographic problem is defined. The lithographic problem represents a particular geometry of a pattern to be printed onto a wafer. This pattern, which is used to optimize the parameters of the lithographic apparatus and to choose a proper configuration of the illumination system, is preferably representative of an aggressive configuration included in the mask layout. This can be, for example, features with 1:1 to 1:20 line to space duty ratio or a pattern regrouping dense features and isolated features.

The geometric and optical parameters of the lithographic apparatus are defined and loaded in a lithography simulation software, such as Prolith™ or Solid-C™. Specifically, the characteristics of the illumination system and the illumination conditions are defined. In the case where a metal plate aperture is used to generate off-axis illumination, the location of the openings in that plate are entered in the simulation software. In the case where off-axis illumination is generated with the multimode generating element described in FIG. 12, the created illumination pattern is entered in the software.

Figure 8:
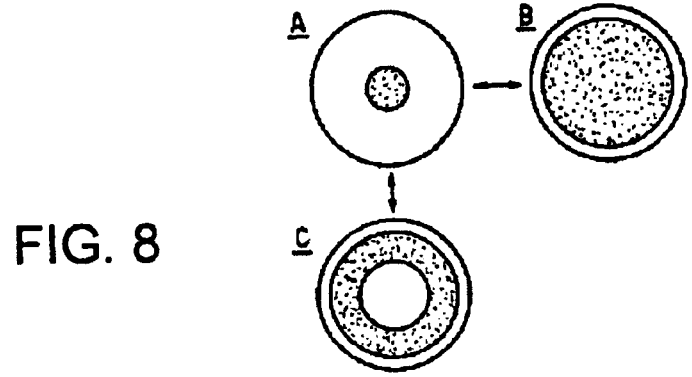
FIG. 8 is a schematic illustration of illumination arrangements obtainable with the illumination systems of FIGS. 6 and 7.
Figure 15:
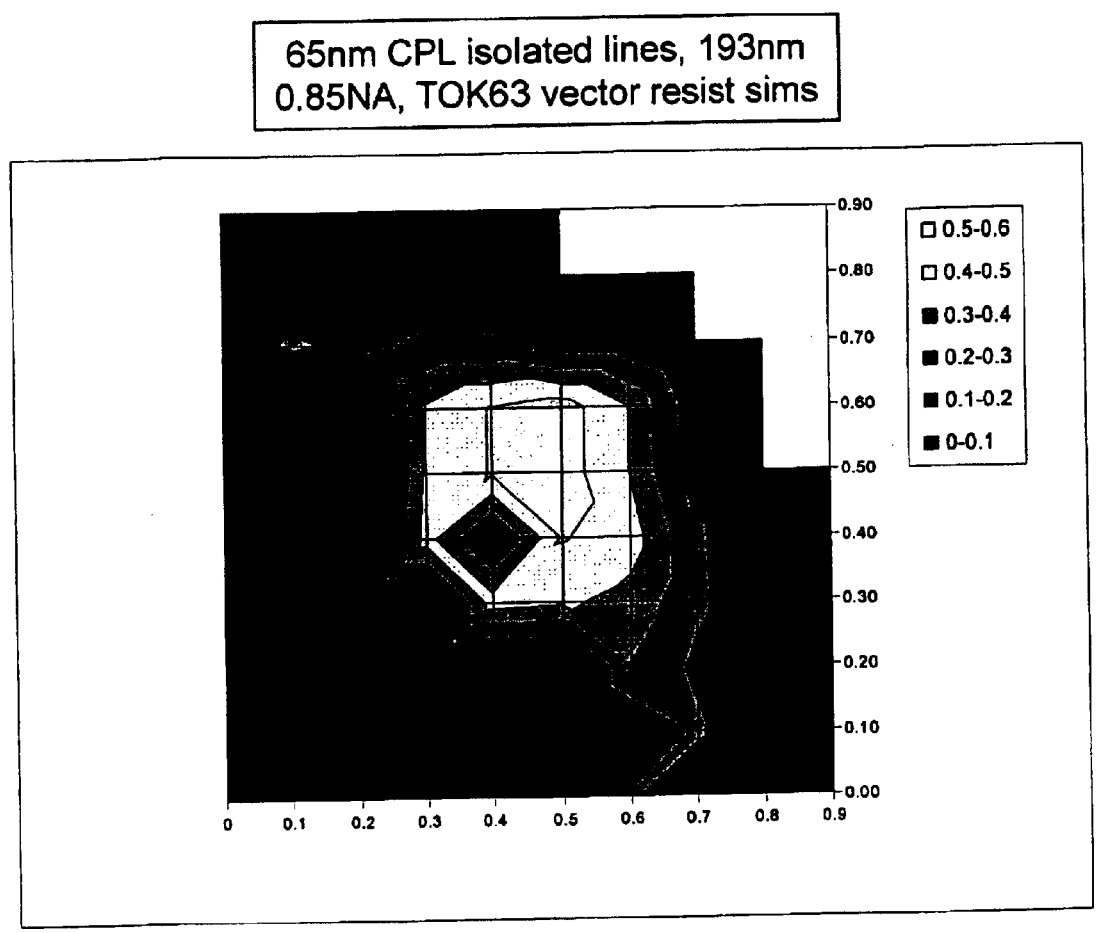
FIG. 15 is a representation of a contour map obtained with the method described in FIG 13.

Illumination files, each representing an individual grid point, are generated and loaded in the simulation software. The light source points contained in the files form a light source point grid that spatially covers the entire cross-section of the illuminator at the pupil plane 18 of the illumination system shown in FIGS. 7–9. The response of the lithographic projection apparatus is calculated for each grid point. The results of the individual responses are plotted on a contour map, such as shown in FIG. 15. Quantitative analysis of the individual source point results allows comparison of different trial illumination arrangements to determine an optimal illumination arrangement.

Figure 14A:
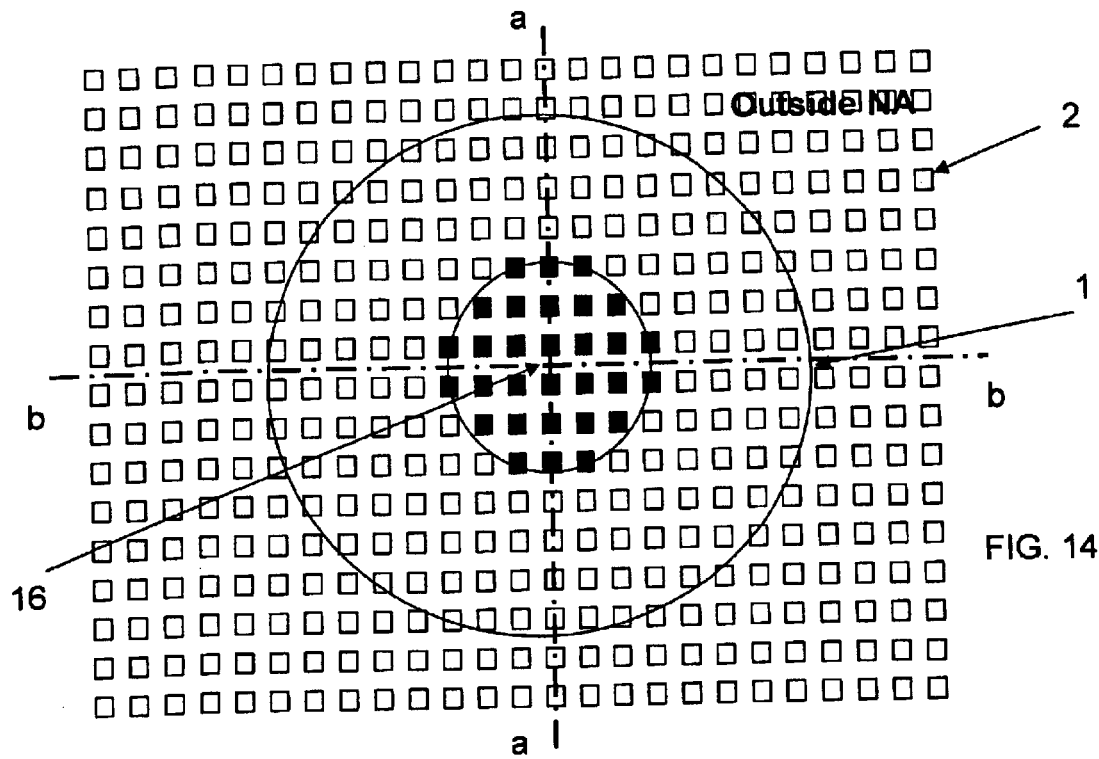
FIG. 14a is a schematic representation of a cross section of the illuminator with a low sigma illumination arrangement.
Figure 14B:
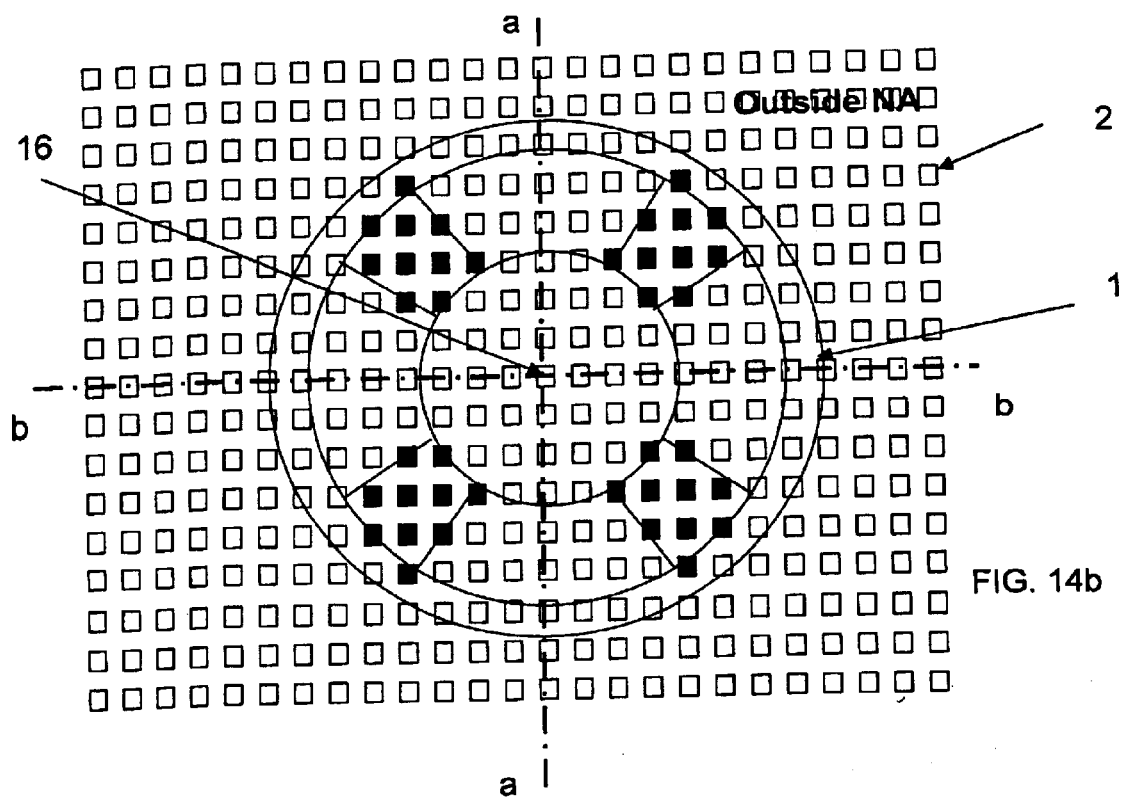
FIG. 14b is a schematic representation of a cross section of the illuminator with a quasar illumination arrangement.

Referring to FIGS. 14(a) and 14(b), the response of the lithographic projection apparatus is calculated for each grid point. The perimeter of the cross section of the illuminator is represented by circle 1, which delineates the contour of the full illuminator aperture (maximum numerical aperture.) The light source grid 2 is also represented in these figures. In order to estimate how a trial illuminator, an illuminator considered for use and configurable with the lithographic projection apparatus, will perform, the trial illuminator pattern is overlaid on the grid and are averaged in some way over the included grid points FIG. 14(a) illustrates an intensity of a projection beam having a circular distribution while FIG. 14(b) illustrates an intensity of a projection beam having a quasar distribution. The physical location of each light source point relative to the full illuminator aperture is set in the individual source point files and can be varied depending on the degree of accuracy desired. A small spacing between each light source point will provide more detailed information on the source response but may notably increase the calculation time. Conversely, a large spacing between each light source point may provide less accurate information on the source response but will significantly decrease the calculation time. In one embodiment of the invention, the spacing of the grid relative to the full illuminator aperture is approximately 0.1. In other embodiments the grid spacing is approximately 0.01 to 0.2.

The method then proceeds to S2 where a resist process to be used to print the pattern is defined, modeled and loaded in the simulation software. Preferably, the resist model should take into account, in the calculation of the resist's critical dimension (or size) and its variation with variables such as dose and focus, the photoresist exposure, the photoresist baking and the photoresist developing. Other responses, such as dense/isolated feature biases, side lobe printing and mask error enhancement factors, may be defined and modeled by the simulation software.

Likewise, the resist model chosen in S2 may take into account, in one embodiment of the invention, the scattering of the electromagnetic field caused by the inhomogeneity of the resist, a nonplanar topography and the vector effects. The vector effects refer to the fact that the electromagnetic wave propagates obliquely when high numerical apertures are used. Although these vector effects can be accounted for when calculating the aerial image, a calculation of the vector effects in air greatly overestimates the contrast loss obtained on the wafer. This is due to the fact that the incident rays tend to be straightened when they propagate in the resist because of the resist's refractive index. Therefore, a resist model with a rigorous electromagnetic calculation may be preferable to accurately determine the resist response.

The choice of the resist model in S2 may also take into account, in one embodiment of the invention, the photoresist baking. A post exposure bake may be used prior to developing the resist pattern. Besides removing the solvent, this allows the regions of high concentration in the photoactive compound to be diffused into the regions of low concentration, thereby smoothing out standing wave patterns. A classical diffusion process may be used to model this baking process. Alternatively, other models accounting for the nonlinear diffusion effects may also be used in another embodiment of the invention.

The method for obtaining the process window for a lithographic problem then proceeds to S3 where a photolithographic response is determined as a function of source point position using a full resist calculation. More precisely, the response is calculated independently for each source point file.

The method then proceeds to S4 where separate responses are calculated for individual source points. This is achieved by varying the dose and focus and by simulating the resist profile using the full resist calculation. The responses obtained provide important responses in terms of depth of focus, exposure latitude and dose-to-size $E_{1:1}$. These responses can then be visualized by plotting the contour map of the results as a function of source location.

Referring to FIG. 15, an example of a contour map obtained with this method is shown. This figure represents the upper right hand quadrant of the illuminator at the pupil plane 18. The response visualized is the depth of focus in microns. As shown in FIG. 15, the source point grid has a 0.1:0 spacing relative to the full aperture of the illuminator. The lithographic problem studied was a pattern of 65 nm isolated lines printed with a chromeless phase lithography (CPL) mask and 0.85 NA 193 nm radiation. For symmetry reasons, only the upper right hand quadrant of the illuminator need be visualized. This contour map represents the depth of focus obtained on the wafer as a function of the source point position in the illuminator. It is shown that only the source points located at approximately 45° (relative to the line orientation on the mask) and a radius of approximately 0.5 to 0.8 have a significant contribution to the depth of focus. Illumination emanating from this region is favorable for printing the isolated lines and illumination from outside this region is not favorable. It is also shown that a maximum depth of focus of about 0.5 to 0.6 μm is expected with the best quasar arrangement. Similar contour maps may be obtained for the exposure latitude and the dose-to-size $E_{1:1}$.

The method then proceeds to calculate expected responses for an actual illuminator. This is achieved by appropriately averaging the responses due to the individual source points captured by the trial illuminator. The average values obtained in S4 represent the estimated performance of the actual illuminator being considered. The method then proceeds to S5 where the illumination arrangement is adjusted based on an analysis of the accumulated results of the separate calculations.

Figure 16:
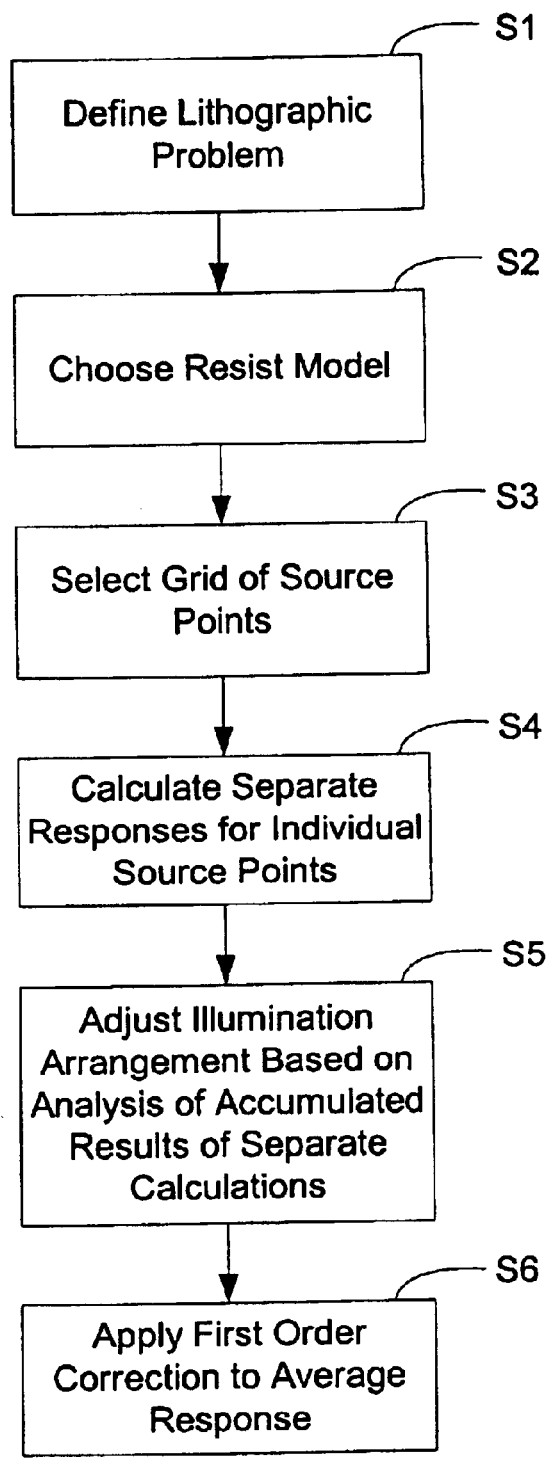
FIG. 16 is a flowchart illustrating a method for optimizing the illumination.

Referring to FIG. 16, an exemplary embodiment of a method for obtaining a refined process window of a lithographic problem will now be explained. In this embodiment, the method begins in S1 and proceeds to S5 in the same way as in the embodiment shown in FIG. 12. The method then proceeds to S6 where a first order dose correction is applied to the average value of the responses. The first order correction may be done by a simple average, i.e. counting the points included in the circle 1. The first order correction may also be done by interpolation to make extra grid points. In a preferred embodiment, the first order correction may still also be done by a weighting of the points based on their calculated sizing doses, i.e. by dose weighted averaging. The lithographic projection apparatus may use only one dose. The calculations, however, determine a best dose for each individual grid point. Even if a point included in the circle 1 provides a good individual response, if its dose is not close to the one provided by the lithographic projection apparatus it does not contribute favorably to the response obtained with the real illuminator. Individual points may thus be weighted on the basis of the difference between their individual dose and the dose of the lithographic projection apparatus. Those points having smaller differences are weighted higher than points having larger differences. The first order correction may also be done by a combination of interpolation and dose weighted averaging.

In one embodiment of the invention, the refined values are obtained by increasing the number of points contained within the aperture. This is done by diminishing the spacing between the source points. In another embodiment of the invention, a linearly interpolated grid may be used in combination with a smaller grid spacing. The interpolated grid provides a smoother averaging process by providing a "higher resolution" grid that reduces numerical errors caused by slight movement of the trial illuminator changing the specific source points captured.

Figure 17:
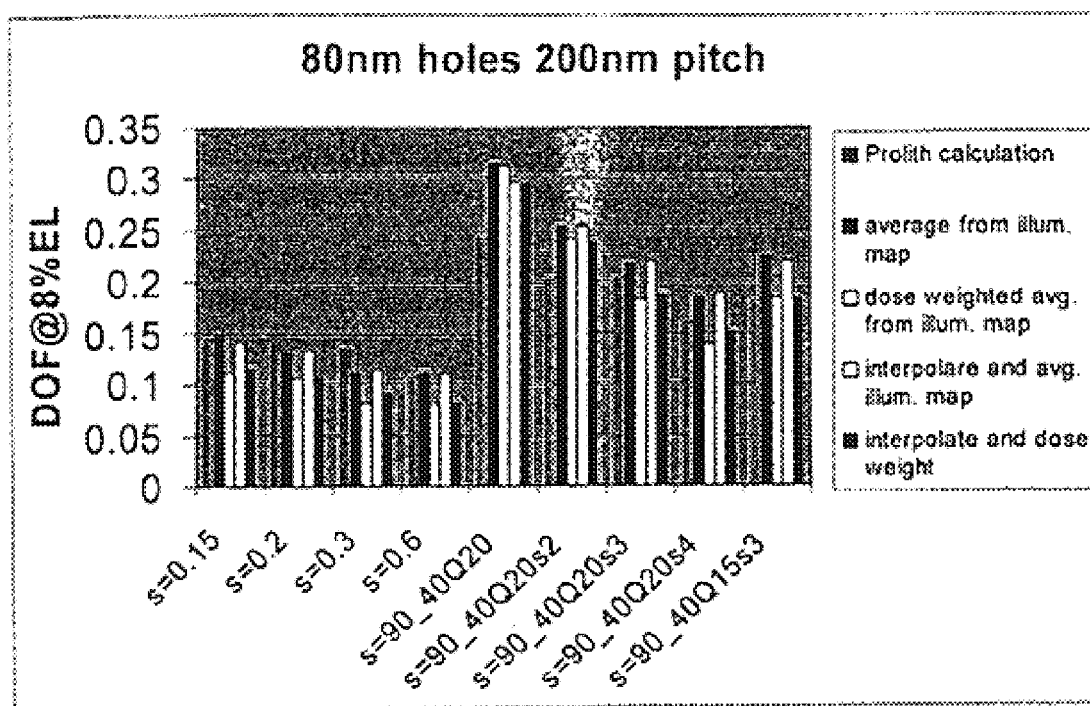
FIG. 17 is a diagram comparing DOF values simulated with various trial illumination conditions with DOF values obtained with the methods described in FIGS. 13 and 16 for several illumination arrangements.
Figure 18A:
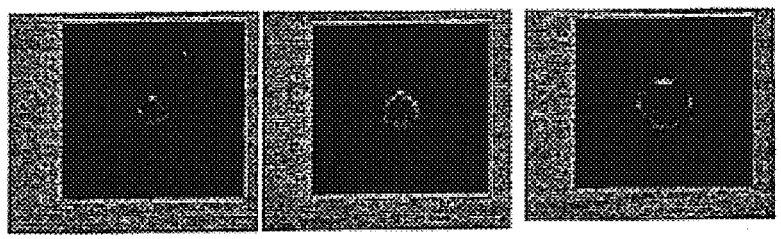
FIGS. 18a–18d are schematic representations of the several illumination arrangements used in FIG. 17.
Figure 18B:
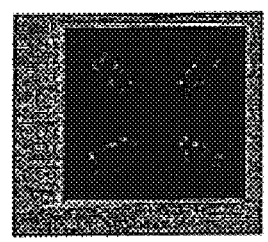
Figure 18C:
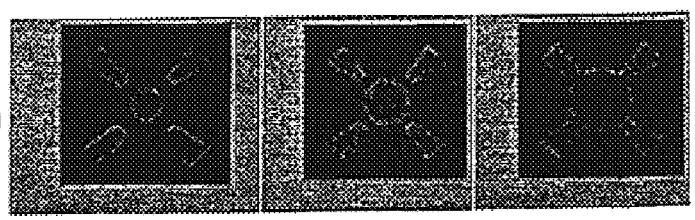
Figure 18D:
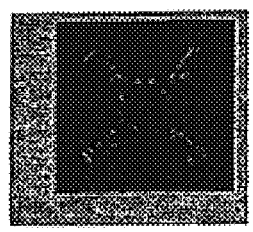

Referring to FIG. 17, simulations obtained with a commercial simulation software using a full resist calculation are compared to calculations obtained with the methods described in FIGS. 13 and 16. Calculation is done for several embodiments set forth above. That is, the depth of focus is calculated either using the DOF value of individual source points (method of FIG. 13, "average from ilium. map"), a first order dose correction ("dose weighted avg. from illum. map"), an interpolated grid ("interpolated and avg. illum. map") or a combination of an interpolated grid and a first order dose correction ("interpolate and dose weight").

The bars in the diagram represent the value of the depth of focus (with a simultaneous 8% exposure latitude constraint) obtained with several arrangements of illuminator. FIG. 18 represents the different arrangements used in this trial. The cross section of the projection beam at the pupil plane 18 is shown for each illuminator. These different illumination arrangements can be obtained, for example, by appropriate adjustment of the multipole generating element 38 in FIG. 9.

The lithographic problem studied in this trial corresponds to a pattern of 80 nm holes with a 200 nm pitch. Simulations of the hole size in resist are made with the commercial software (Prolith™) using full illuminator calculations and the results are compared to the averaged results of the grid simulations. The comparison of the different averaging approaches discussed above to the calculations obtained with the trial illuminator allow a quantitative analysis of the accuracy of the averaging methods and selection of the best illuminator. As averaging calculated grid points requires less time than running simulations of various trial illuminators, the present invention can more quickly determine the best illuminator for a particular lithographic problem.

FIG. 17 indicates that both the lengthy Prolith™ calculation and the calculations obtained with the methods described in FIGS. 13 and 16 concur on the choice of dose weighted interpolation for the best illuminator.

Referring to FIG. 19, predictions of the DOF value (simultaneously constrained to at least 8% exposure latitude) based on the weighted and interpolated source measurements are compared to the prediction obtained with Prolith™. The comparison is made for several trial illuminators (shown in FIG. 18). Data indicate that predictions obtained with the method of the present invention satisfactorily match the prediction obtained with Prolith™. These results point out that the method of the present invention favorably match the predictions obtained with the actual illuminator and used for source selection, optimization, and design.

Figure 20:
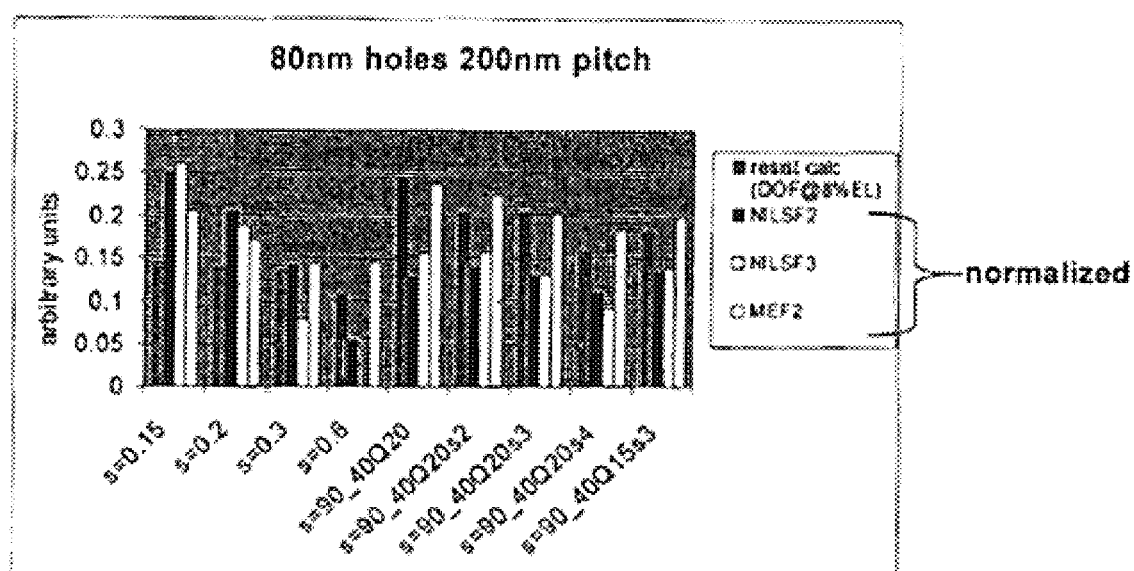
FIG. 20 is a diagram comparing DOF values obtained with a commercial simulation software using full illuminator calculation to DOF values obtained with the methods described in FIGS. 13 and 16 for the illumination arrangements shown in FIG. 18.

Referring to FIG. 20, predictions obtained with a full resist calculation (according to the method described in FIG. 13) are compared to the predictions obtained with standard scalar aerial image metrics at different defocus values. The defocus used for maximizing the process window and determining the best illumination conditions are 0.2 μm and 0.3 μm. The lithographic problem studied is the same as above and corresponds to a pattern of 80 nm holes with a 200 nm pitch and the trial illuminators used are identical to those described in FIG. 18. Results indicate that the aerial image metrics predict the best illuminator to a lesser extent.

Figure 21:
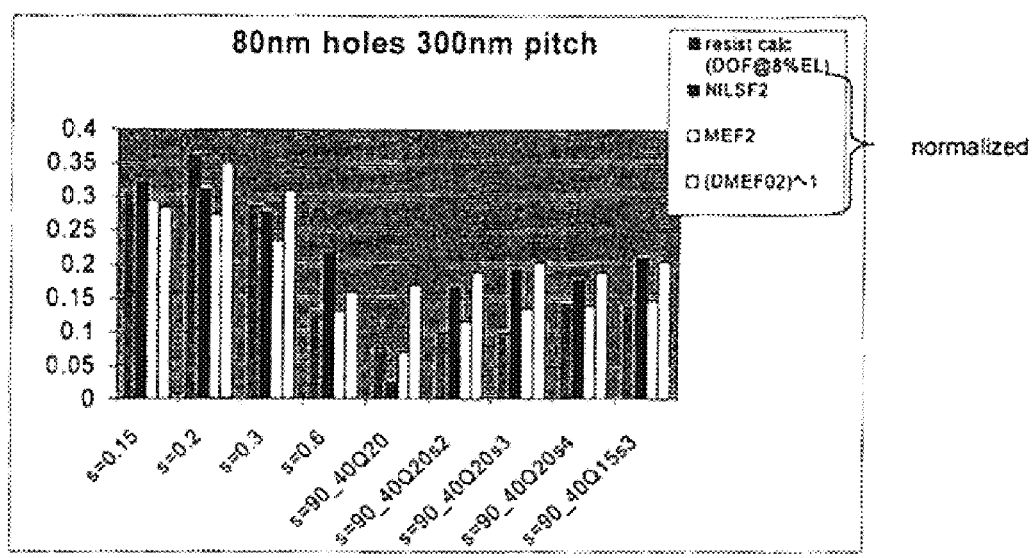
FIG. 21 is a diagram comparing DOF values obtained with a commercial simulation software using full illuminator calculation to DOF values obtained with the methods described in FIGS. 13 and 16 for the illumination arrangements shown in FIG. 18.

Referring to FIG. 21, a similar trial as in FIG. 20 is carried out for a different lithographic problem. The lithographic problem studied in this trial corresponds to a pattern of 80 nm holes with a 300 nm pitch. Both NILS and aerial imagery intensity at the mask edge miss the best illuminator predicted by the full resist simulations.

Results in the trials described in FIGS. 20 and 21 indicate that NILS measurements, conventionally used to maximize the process window, less precisely predict the best illumination conditions and further do not quantitatively predict the process window. The fall off in accuracy is expected to be worse as NA increases (stronger vector effects) and for certain processes which are designed to print far away from the aerial image limit.

While specific embodiments of the invention have been described above, it will be appreciated that the invention may be practiced other than as described. The description is not intended to limit the invention.

What is claimed is:

1. A method for optimizing the illumination conditions of a lithographic apparatus by computer simulation using full resist calculation, the lithographic apparatus comprising an illuminator, a projection system, and a mask having a pattern to be printed in a layer of photoresist material formed on a substrate, the method comprising:

defining a lithographic pattern to be printed on a wafer;

choosing a resist model of a resist process to be used to print the pattern in the layer of photoresist material;

selecting a grid of source points in a pupil plane of the illuminator;

calculating separate responses for individual source points, each of the responses representing a result of a single or series of simulations using the resist model; and adjusting an illumination arrangement based on analysis of accumulated results of the separate calculations.

2. A method according to claim 1, wherein the response is a focus exposure matrix and results in a process window that includes dose latitude and depth of focus information.

3. A method according to claim 1, further comprising calculating of response of trial illumination schemes by averaging separate responses for the individual source points contained within the illumination arrangement.

4. A method according to claim 1, wherein the response is E1:1, dense to isolated feature bias, arbitrary feature size biases, sidelobe printing, film loss, sidewall angle, mask error enhancement factor, linear resolution, or absolute resolution.

5. A method according to claim 1, further comprising mapping the responses as a function of individual source points positions.

6. A method according to claim 3, further comprising applying a dose weighted averaging of the responses.

7. A method according to claim 1, wherein the simulated grid results are interpolated to increase the grid point density to aid in averaging.

8. A method according to claim 1, wherein adjusting the illumination arrangement includes adjusting the illumination arrangement by varying a position of an axicon/zoom module relative to a pyramidal prism, a position of a diffractive optical element, a position of an aperture blade, or by adjusting a programmable mirror array.

9. A method according to claim 8, wherein the grid spacing is within a range from 0.01 to 0.2.

10. A method according to claim 1, wherein defining the illumination arrangement includes selecting a multipole illuminator arrangement.

11. A method according to claim 1, wherein defining the illumination arrangement includes defining an illumination arrangement with a multipole generating clement.

12. A method according to claim 1, wherein the resist model is a calibrated model capable of adequately predicting experimental results.

13. A method according to claim 1, wherein defining the resist model includes defining a resist model taking into account at least one of vector effects, non-zero diffusion of active species, and finite dissolution contrast.

* * * * *

UNITED STATES PATENT AND TRADEMARK OFFICE
CERTIFICATE OF CORRECTION

PATENT NO. : 6,839,125 B2
DATED : January 4, 2005
INVENTOR(S) : Steven G. Hansen It is certified that error appears in the above-identified patent and that said Letters Patent is hereby corrected as shown below:

<u>Title page,</u>
Item [57], ABSTRACT,
Line 7, replace the word "Oproblem" with -- problem --.

Signed and Sealed this

Sixteenth Day of August, 2005

JON W. DUDAS
*Director of the United States Patent and Trademark Office*